(12) United States Patent
Yoneda et al.

(10) Patent No.: US 8,410,557 B2
(45) Date of Patent: Apr. 2, 2013

(54) SEMICONDUCTOR DEVICE AND METHOD OF MANUFACTURING THE SAME

(75) Inventors: Haruki Yoneda, Ogaki (JP); Kazuhiro Sasada, Hashima (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 174 days.

(21) Appl. No.: 12/486,062

(22) Filed: Jun. 17, 2009

(65) Prior Publication Data

US 2009/0321852 A1 Dec. 31, 2009

(30) Foreign Application Priority Data

Jun. 27, 2008 (JP) ................................. 2008-168185

(51) Int. Cl.
*H01L 29/66* (2006.01)

(52) U.S. Cl. ........ 257/409; 257/401; 257/402; 257/492; 257/493

(58) Field of Classification Search .................. 257/491, 257/492

See application file for complete search history.

(56) References Cited

U.S. PATENT DOCUMENTS

| | | | | |
|---|---|---|---|---|
| 5,191,401 A * | 3/1993 | Shirai et al. | ..................... | 257/328 |
| 5,406,110 A * | 4/1995 | Kwon et al. | ..................... | 257/493 |
| 5,510,643 A * | 4/1996 | Kariyama | ..................... | 257/409 |
| 5,559,348 A * | 9/1996 | Watabe et al. | ..................... | 257/141 |
| 5,854,113 A * | 12/1998 | Kang et al. | ..................... | 438/294 |
| 5,874,768 A * | 2/1999 | Yamaguchi et al. | ..................... | 257/493 |
| 6,160,290 A * | 12/2000 | Pendharkar et al. | ..................... | 257/339 |
| 6,180,959 B1 * | 1/2001 | Iwasaki et al. | ..................... | 257/77 |
| 6,365,932 B1 * | 4/2002 | Kouno et al. | ..................... | 257/341 |
| 6,376,891 B1 * | 4/2002 | Nagatani et al. | ..................... | 257/492 |
| 6,521,962 B2 * | 2/2003 | Evans | ..................... | 257/409 |
| 6,614,075 B2 * | 9/2003 | Mori et al. | ..................... | 257/336 |
| 6,614,077 B2 * | 9/2003 | Nakamura et al. | ..................... | 257/355 |
| 6,617,652 B2 * | 9/2003 | Noda | ..................... | 257/367 |
| 6,713,794 B2 * | 3/2004 | Suzuki | ..................... | 257/288 |
| 6,773,995 B2 * | 8/2004 | Shin et al. | ..................... | 438/270 |
| 6,825,543 B2 * | 11/2004 | Shimotsusa et al. | ..................... | 257/491 |
| 6,876,035 B2 * | 4/2005 | Abadeer et al. | ..................... | 257/343 |
| 6,897,525 B1 * | 5/2005 | Kikuchi et al. | ..................... | 257/343 |
| 6,924,531 B2 * | 8/2005 | Chen et al. | ..................... | 257/336 |
| 6,963,109 B2 * | 11/2005 | Kikuchi et al. | ..................... | 257/335 |
| 7,109,562 B2 * | 9/2006 | Lee | ..................... | 257/488 |
| 7,161,223 B2 * | 1/2007 | Beasom | ..................... | 257/493 |
| 7,180,152 B2 * | 2/2007 | Herman | ..................... | 257/492 |

(Continued)

FOREIGN PATENT DOCUMENTS

| | | |
|---|---|---|
| JP | 9-223793 | 8/1997 |
| JP | 2005-243832 | 9/2005 |

*Primary Examiner* — Fernando L. Toledo
*Assistant Examiner* — Mohammed Shamsuzzaman
(74) *Attorney, Agent, or Firm* — Morrison & Foerster LLP

(57) ABSTRACT

A P type drift layer is formed in an N type epitaxial layer from under a drain layer to under an N type body layer under a source layer through under an element isolation insulation film. This P type drift layer is shallower immediately under the drain layer than under the element isolation insulation film, and gradually shallows from under the element isolation insulation film to the N type body layer to be in contact with the bottom of the N type body layer. Since the P type drift layer is thus diffused in a wide region, a wide current path is formed from the N type body layer to the drain layer, and the current drive ability is enhanced and the drain breakdown voltage is also increased.

3 Claims, 5 Drawing Sheets

U.S. PATENT DOCUMENTS

| | | | |
|---|---|---|---|
| 7,238,987 B2* | 7/2007 | Ikuta et al. | 257/343 |
| 7,291,883 B2* | 11/2007 | Kanda et al. | 257/328 |
| 7,385,250 B2* | 6/2008 | Omura et al. | 257/341 |
| 7,408,234 B2* | 8/2008 | Ichijo et al. | 257/409 |
| 7,468,537 B2* | 12/2008 | Pendharkar | 257/335 |
| 7,537,983 B2* | 5/2009 | Uchihara et al. | 438/163 |
| 7,602,037 B2* | 10/2009 | Lin et al. | 257/492 |
| 7,705,399 B2* | 4/2010 | Tanaka et al. | 257/341 |
| 7,709,908 B2* | 5/2010 | Su et al. | 257/409 |
| 7,741,662 B2* | 6/2010 | Kao | 257/288 |
| 7,759,759 B2* | 7/2010 | Tsuchiko | 257/471 |
| 7,910,991 B2* | 3/2011 | Yang et al. | 257/341 |
| 2001/0025961 A1* | 10/2001 | Nakamura et al. | 257/107 |
| 2002/0072159 A1* | 6/2002 | Nishibe et al. | 438/179 |
| 2002/0072178 A1* | 6/2002 | Cai et al. | 438/289 |
| 2002/0093065 A1* | 7/2002 | Kikuchi et al. | 257/409 |
| 2003/0001216 A1* | 1/2003 | de Fresart et al. | 257/409 |
| 2004/0053471 A1* | 3/2004 | Kikuchi et al. | 438/286 |
| 2005/0035424 A1* | 2/2005 | Beasom | 257/493 |
| 2006/0113592 A1* | 6/2006 | Pendharkar et al. | 257/335 |
| 2006/0118902 A1* | 6/2006 | Ikuta et al. | 257/491 |
| 2006/0145285 A1* | 7/2006 | Lee | 257/492 |
| 2006/0175658 A1* | 8/2006 | Lee | 257/341 |
| 2006/0186507 A1* | 8/2006 | Kanda et al. | 257/491 |
| 2006/0192257 A1* | 8/2006 | Lee | 257/409 |
| 2007/0048961 A1* | 3/2007 | Chang et al. | 438/386 |
| 2007/0200171 A1* | 8/2007 | Tanaka et al. | 257/341 |
| 2007/0272986 A1* | 11/2007 | Williams et al. | 257/371 |
| 2008/0067588 A1* | 3/2008 | Williams et al. | 257/343 |
| 2008/0067617 A1* | 3/2008 | Hachiyanagi et al. | 257/409 |
| 2008/0093700 A1* | 4/2008 | Huang | 257/500 |
| 2008/0122006 A1* | 5/2008 | Williams et al. | 257/371 |
| 2008/0128804 A1* | 6/2008 | Ishikawa | 257/337 |
| 2008/0203497 A1* | 8/2008 | Lee et al. | 257/409 |
| 2008/0224210 A1* | 9/2008 | Cai | 257/338 |
| 2009/0072326 A1* | 3/2009 | Kao | 257/409 |
| 2009/0090983 A1* | 4/2009 | Adkisson et al. | 257/409 |
| 2009/0114987 A1* | 5/2009 | Tanaka | 257/335 |
| 2009/0166727 A1* | 7/2009 | Zundel et al. | 257/329 |
| 2009/0212361 A1* | 8/2009 | Kitajima | 257/343 |
| 2009/0321845 A1* | 12/2009 | Cai | 257/369 |
| 2010/0025764 A1* | 2/2010 | Kitajima et al. | 257/343 |
| 2010/0038706 A1* | 2/2010 | Kitajima | 257/328 |
| 2010/0109078 A1* | 5/2010 | Stefanov et al. | 257/329 |
| 2010/0123195 A1* | 5/2010 | Lee | 257/335 |
| 2010/0163991 A1* | 7/2010 | Kim et al. | 257/343 |
| 2010/0221884 A1* | 9/2010 | Tanaka | 438/286 |
| 2010/0301411 A1* | 12/2010 | Takeda et al. | 257/335 |
| 2011/0018032 A1* | 1/2011 | Kondo et al. | 257/192 |

\* cited by examiner

SEMICONDUCTOR DEVICE AND METHOD OF MANUFACTURING THE SAME

CROSS-REFERENCE OF THE INVENTION

This application claims priority from Japanese Patent Application No. 2008-168185, the content of which is incorporated herein by reference in its entirety.

BACKGROUND OF THE INVENTION

1. Field of the Invention

The invention relates to a semiconductor device and a method of manufacturing the same, particularly, a semiconductor device of a high breakdown voltage transistor and a method of manufacturing the same.

2. Description of the Related Art

A high breakdown voltage MOS transistor using a LOCOS (Local Oxidation of Silicon) offset method is conventionally known. Hereafter, a method of manufacturing this high breakdown voltage MOS transistor will be described referring to FIGS. 9A to 9E.

As shown in FIG. 9A, a pad oxide film 22 is formed on a front surface of an N type silicon substrate 21 or a silicon substrate 21 formed with an N well by thermal oxidation, and a silicon nitride film 23 is formed on the pad oxide film 22 by a low pressure CVD method or the like.

Then, as shown in FIG. 9B, the silicon nitride film 23 in portions for forming element isolation regions and for forming P type drift layers serving as offset drain regions is etched and removed by a predetermined photolithography process or the like. Then, portions except the portions for forming the offset drain regions are covered by a photoresist film (not shown), and P-type impurities are ion-implanted using the photoresist film and the silicon nitride film 23 as a mask to form P type layers 24a of which the concentrations are relatively low and which are to be the offset drain regions.

Then, as shown in FIG. 9C, thermal oxidation and thermal diffusion are performed using the silicon nitride film 23 as a mask to form element isolation oxide films 25 having a thickness of about 500 nm on the front surface of the silicon substrate 21 and form P type drift layers 24b which are to be the offset drain regions. The silicon nitride film 23 and so on are then removed by etching.

Then, as shown in FIG. 9D, N type impurities 26 are ion-implanted in the silicon substrate 21 using the oxide films 25 as a mask in order to adjust the threshold voltage, and then a gate oxide film 27 is formed on the front surface of the silicon substrate 21. A polysilicon film is then deposited by a CVD method, and a gate electrode 28 made of the polysilicon film is formed by a predetermined photolithography process or the like.

Then, as shown in FIG. 9E, impurities are ion-implanted using the gate electrode 28 and the oxide films 25 as a mask to form a high concentration P type source layer 29 and a high concentration P type drain layer 30. In this manner, a high breakdown voltage MOS transistor 32 having a channel region 31 between the P type drift layer 24b and the P type source layer 29 is completed.

In the conventional high breakdown voltage MOS transistor 32, in order to enhance the reliability by increasing the drain breakdown voltage by relieving the electric field intensity at the side end portion of the P type drift layer 24b abutting the channel region 31, the impurity concentration of the P type drift layer 24b serving as the offset drain region need be decreased so that the depletion layer expands.

On the other hand, the current drive ability of the high breakdown voltage MOS transistor need be enhanced, and the impurity concentration of the P type drift layer 24b serving as the offset drain region need be increased to decrease the resistance of the current path. It means that the high breakdown voltage characteristics and the high current drive ability are in a tradeoff relation, and thus it is difficult to use the best of both the characteristics and ability respectively in the conventional high breakdown voltage MOS transistor 32.

Therefore, the invention is directed to providing a high breakdown voltage transistor having a high drain breakdown voltage and high current drive ability for the market desiring a high performance high breakdown voltage transistor.

SUMMARY OF THE INVENTION

The invention provides a semiconductor device includes: a semiconductor layer of a first conductive type; an element isolation insulation film formed on a front surface of said semiconductor layer; a body layer of the first conductive type formed on the front surface of said semiconductor layer near one end of said element isolation insulation film; a drain layer of a second conductive type formed on the front surface of said semiconductor layer near other end of said element isolation insulation film; a source layer of the second conductive type formed on a front surface of said body layer; a gate insulation film formed on said body layer; a gate electrode extending from on said element isolation insulation film onto said body layer with said gate insulation film being interposed therebetween; and a drift layer expanding in said semiconductor layer from under said drain layer to under said body layer under said source layer, wherein said drift layer is shallower immediately under said drain layer than under said element isolation insulation film, and gradually shallows from under said element isolation insulation film to the said body layer to be in contact with a bottom of said body layer.

The invention also provides a method of manufacturing a semiconductor device, including: implanting impurities of a second conductive type selectively in a front surface of a semiconductor layer of a first conductive type; forming an element isolation insulation film by selectively oxidizing a region where said impurities are implanted, and forming a drift layer of the second conductive type by diffusing said impurities, forming a body layer of the first conductive type near one end of said element isolation insulation film based on said element isolation insulation film; forming a gate insulation film on said body layer; forming a gate electrode from on said element isolation insulation film onto said body layer with said gate insulation film being interposed therebetween; and forming a source layer of the second conductive type on a front surface of said body layer and forming a drain layer of the second conductive type near other end of said element isolation insulation film, wherein said drift layer is diffused in said semiconductor layer from under said drain layer to under said body layer under said source layer so as to be shallower immediately under said drain layer than under said element isolation insulation film and gradually shallow from under said element isolation insulation film to said body layer.

DETAILED DESCRIPTION OF THE INVENTION

Figure 1:
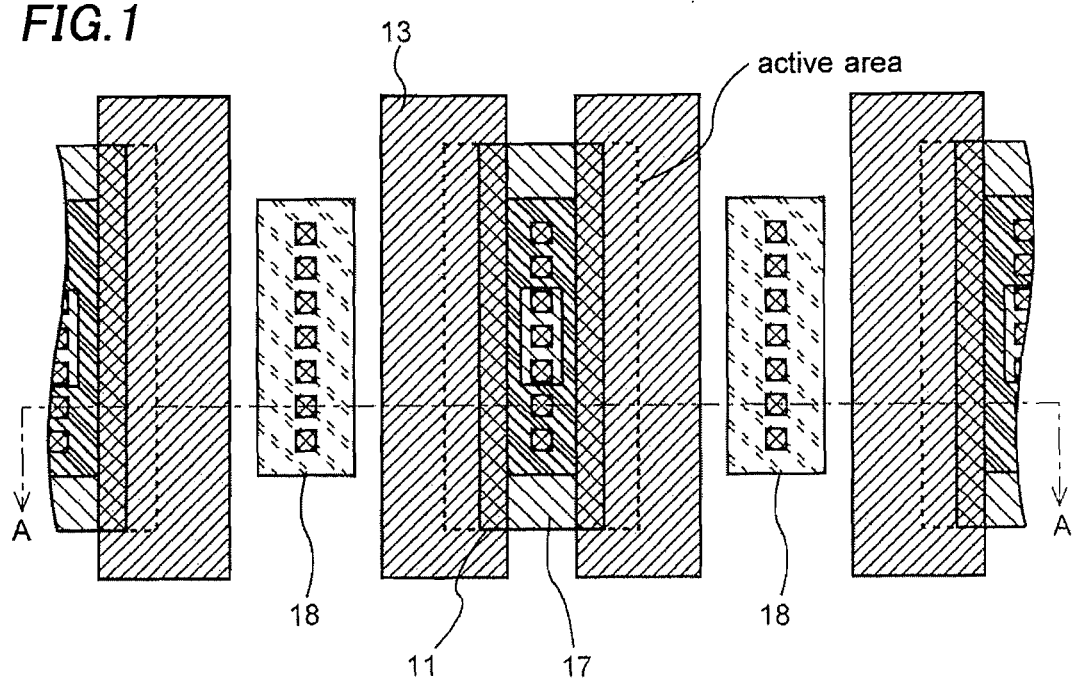
FIG. 1 is a plan view showing a semiconductor device of an embodiment of the invention.

An embodiment of the invention will be described below referring to figures. In this high breakdown voltage MOS transistor, in order to increase the channel width, the gate electrodes 13, the source layers 17 and the drain layers 18 are formed repeatedly, but FIG. 1 shows these partially. Hereafter, a main part of the structure of the high breakdown voltage MOS transistor will be described first, and then a method of manufacturing the same will be described in detail.

Figure 2:
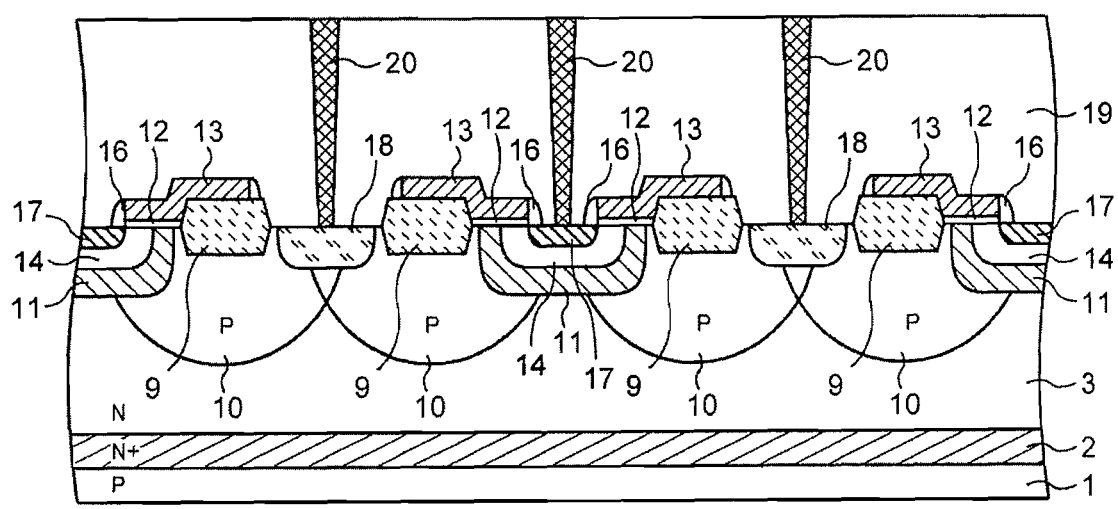
FIG. 2 is a cross-sectional view of the semiconductor device of FIG. 1 along line A-A.

As shown in FIG. 2, an N+ type embedded layer 2 is formed on a front surface of a P type semiconductor substrate 1, and an N type epitaxial layer 3 is formed on the N+ type embedded layer 2. Element isolation insulation films 9 are formed on the front surface of the N type epitaxial layer 3 by LOCOS, and the N type body layers 11 are formed near one ends of these element isolation insulation films 9 on the front surface of the N type epitaxial layer 3. The P+ type drain layers 18 are further formed near the other ends of the element isolation insulation films 9 on the front surface of the N type epitaxial layer 3. The P+ type source layers 17 are formed on the front surface of the N type body layers 11.

Gate insulation films 12 are formed on the N type body layers 11, and the gate electrodes 13 are formed extending from on the element isolation insulation films 9 onto the N type body layers 11 with the gate insulation films 12 being interposed therebetween, respectively. P type drift layers 10 are formed in the N type epitaxial layer 3 from under the drain layers 18 to under the N type body layers 11 under the source layers 17 through under the element isolation insulation films 9, respectively. This P type drift layers 10 are shallower immediately under the drain layers 18 than under the element isolation insulation films 9.

Since the P type drift layers 10 are thus diffused in these wide regions, wide current paths are formed from the N type body layers 11 to the drain layers 18 to achieve high current drive ability. The P type drift layers 10 which are shallower immediately under the drain layers 18 than under the element isolation insulation films 9 also contribute to the high current drive ability.

Furthermore, since the P type drift layers 10 are diffused in the wide regions as described above and are shallower immediately under the drain layers 18 than under the element isolation insulation films 9, the areas of the PN junctions formed by the P type drift layers 10 and the N type epitaxial layer 3 are increased. As a result of this, the depletion layers of the drain layers 18 expand widely and the electric fields of the drain layers 18 are relieved, thereby achieving a high drain breakdown voltage.

The N type channel layers 14 are formed on the front surface of the N type body layers 11, and the gate electrodes 13 are disposed on these N type channel layers 14 with the gate insulation films 12 being interposed therebetween. It means that the N type body layers 11 and the N type channel layers 14 under the gate electrodes 13 form the channel regions of the high breakdown voltage transistor.

The impurity concentrations of the N type channel layers 14 are preferably higher than the impurity concentrations of the N type body layers 11. The threshold Vt of the high breakdown voltage transistor is thus determined by the impurity concentrations of the N type channel layers 14.

On the other hand, each of the P type drift layers 10 gradually shallows from under the element isolation insulation film 9 to under the N type body layer 11 and the end portion is on the bottom of the N type body layer 11, and thus the area of the PN junction formed by the P type drift layer 10 and the N type epitaxial layer 3 under the source layer 17 is increased to make the drain breakdown voltage high. The drain breakdown voltage in this portion is thus determined by the contact portion of the P type drift layer 10 and the N type body layer 11. Furthermore, the drain breakdown voltage is increased by setting the impurity concentration of the N type body layer 11 at an optimum value to compensate the impurity concentration of the P type drain layer. In this case, since the threshold Vt of the high breakdown voltage transistor is determined by the impurity concentration of the N type channel layer 14, threshold Vt is not influenced even if the impurity concentration of the N type body layer 11 is set low. It means that the structure described above realizes an independent control of the drain breakdown voltage and the threshold Vt of the high breakdown voltage transistor.

Furthermore, in the embodiment, the transistor has a pattern where the gate electrodes 13, the source layers 17 and the drain layers 18 are formed repeatedly, and a symmetrical structure relative to the source layer 17 or the drain layer 18. By superposing the P type drift layers 10, 10 next to each other under the drain layer 18, the impurity concentration in this superposed portion is increased. Such a structure also advantageously contributes to the increase of the current drive ability.

On the other hand, by expanding the P type drift layers 10, 10 next to each other onto the bottom of the N type body layer 11 under the source layer 17 to the extent that these P type drift layers 10, 10 next to each other do not contact each other, the areas of the PN junctions are increased to make the drain breakdown voltage high.

Figure 3:
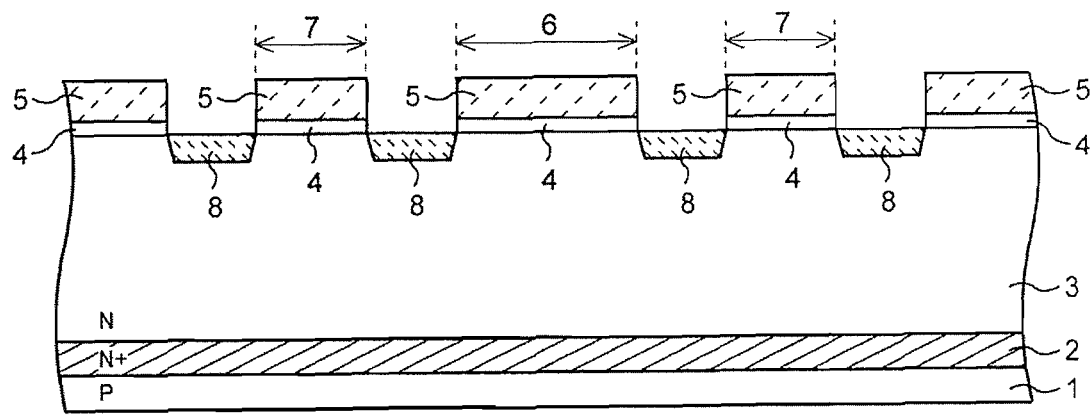
FIG. 3 is a cross-sectional view showing the semiconductor device and a method of manufacturing the same of the invention.

Hereafter, a method of manufacturing the high breakdown voltage transistor described above will be described referring to FIGS. 3 to 8. As shown in FIG. 3, the P type semiconductor substrate 1 (e.g. a P type silicon single crystal substrate) is provided first, the N+ type embedded layer 2 is formed on the front surface thereof by a predetermined process, and the N type epitaxial layer 3 is further formed on the front surface thereof by an epitaxial method so as to have a predetermined thickness.

Then, a thin thermal oxide film 4 for pads is formed on the front surface of the N type epitaxial layer 3, and a silicon nitride film 5 is further formed thereon by a low pressure CVD method or the like. Then, a photoresist film (not shown) having openings in regions for forming the P type drift layers 10 and the element isolation insulation films 9 which will be described below is formed by a predetermined photoresist process. Then, the silicon nitride film 5 and so on exposed in the regions for forming the P type drift layers and so on are etched and removed by dry-etching or the like, and then the photoresist film is removed with predetermined chemicals or by ashing.

Then, P-type impurities are implanted in the N type epitaxial layer 3 through the openings formed by the etching described above by an ion implantation method to form P type layers 8. In this case, since the impurities are to be driven in at high temperature after the ion implantation, the P type layers 8 need be formed only shallow in the front surface of the N type epitaxial layer 3 and thus the P type layers 8 are preferably formed by properly controlling the concentration of the P-type impurities. By this process, the source cell regions 6 where the source layers and so on are to be formed subsequently and the drain cell regions 7 where the drain layers are to be formed subsequently are formed between the P type layers 8, respectively.

Figure 4:
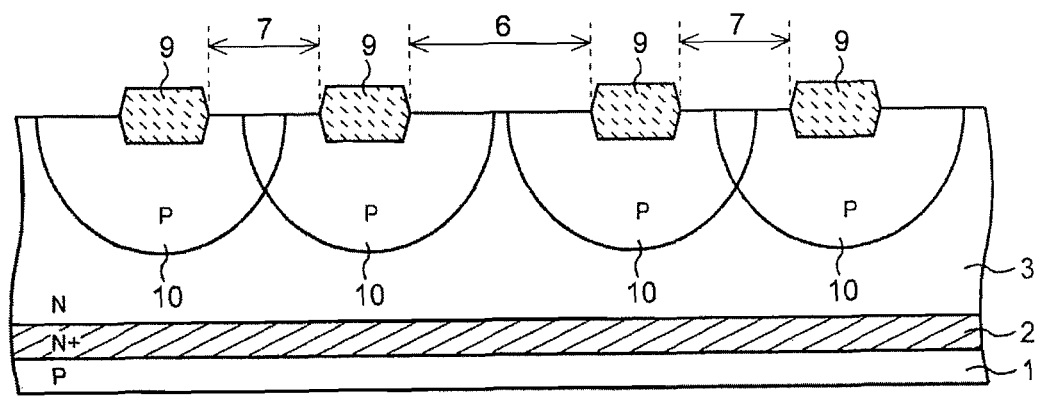
FIG. 4 is a cross-sectional view showing the semiconductor device and the method of manufacturing the same of the invention.

Then, as shown in FIG. 4, by thermal oxidation at high temperature of 1100° C. or more using the silicon nitride film 5 as an anti-oxidation mask, the element isolation insulation films 9 made of a thermal oxide film are formed, and also the P type layers 8 are driven in to form the P type drift layers 10 which are P type deep diffusion layers. The P type drift layers 10 are diffused deep into the source cell regions 6 as shown, and each two of the P type drift layers 10 are diffused from both the sides of each of the drain cell regions 7 and superposed in the drain cell region 7, thereby increasing the concentration of the P-type impurities in this superposed portion and decreasing the resistance of the P type drift layer 10 in this portion.

Figure 5:
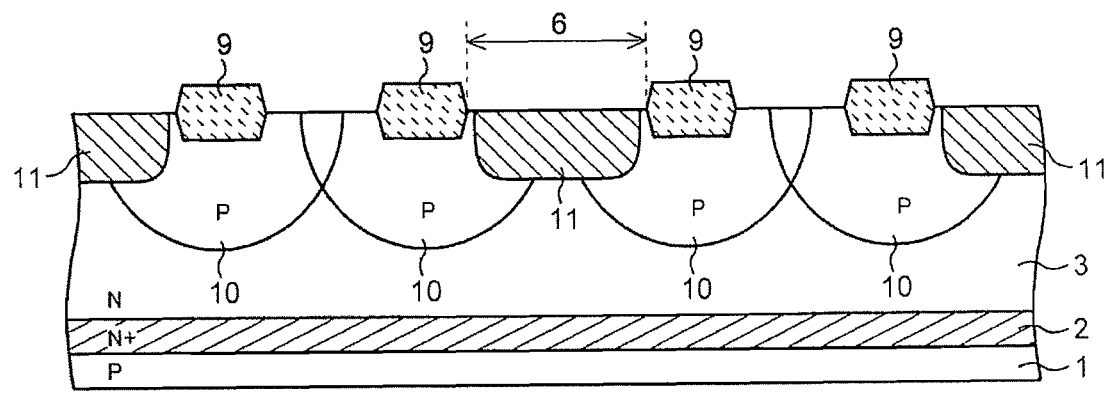
FIG. 5 is a cross-sectional view showing the semiconductor device and the method of manufacturing the same of the invention.

Then, as shown in FIG. 5, a photoresist film (not shown) having openings in the source cell regions 6 is formed by a predetermined photolithography process based on the pattern of the element isolation insulation films 9 as an alignment mark, and N type impurities are ion-implanted in the semiconductor layer through the openings of this photoresist film using this photoresist film as a mask to form the N type body layers 11. Since the N type body layers 11 are formed based on the pattern of the element isolation insulation films 9, the positional relations of the N type body layers 11 to the P type drift layers 10 formed together with the element isolation insulation films 9 are stabilized and the reproducibility is high. Therefore, the characteristics of the breakdown voltages determined by the P type drift layers 10 at the end portions of the N type body layers 11 are not largely varied, thereby realizing the high reproducibility.

Figure 6:
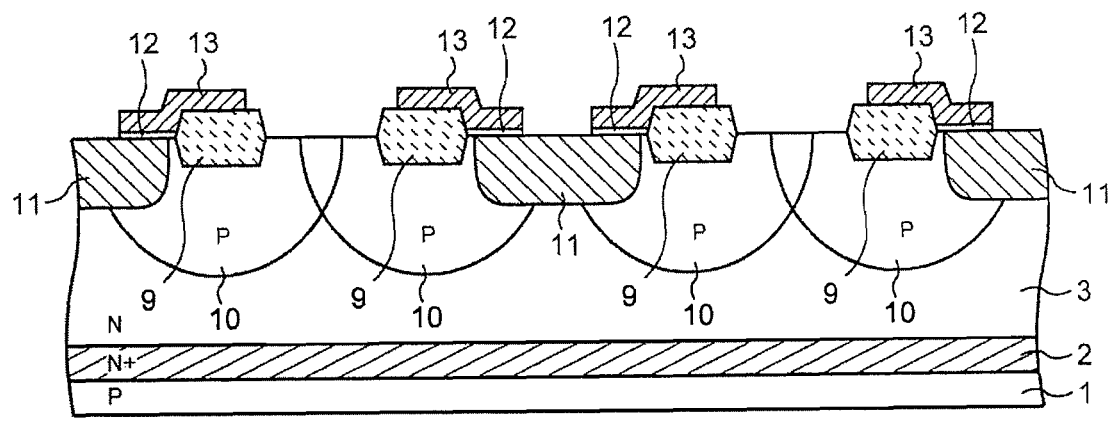
FIG. 6 is a cross-sectional view showing the semiconductor device and the method of manufacturing the same of the invention.

Then, as shown in FIG. 6, the gate insulation films 12 are formed on the front surface of the semiconductor layer including on the N type body layers 11. Then, a polysilicon film is formed on the gate insulation films 12 by a CVD or the like, and a predetermined photolithography process or the like is performed thereto to form the gate electrodes 13. The gate electrode 13 has an opening on the N type body layer 11, and extends from on the gate insulation films 12 onto the element isolation insulation films 9. Since the alignment mark in this case is also based on the pattern of the element isolation insulation films 9, the positional relations of the gate electrodes 13 to the N type body layers 11 are not largely shifted, and as described below, the breakdown voltage and the threshold voltage are not influenced even if these are slightly shifted.

Figure 7:
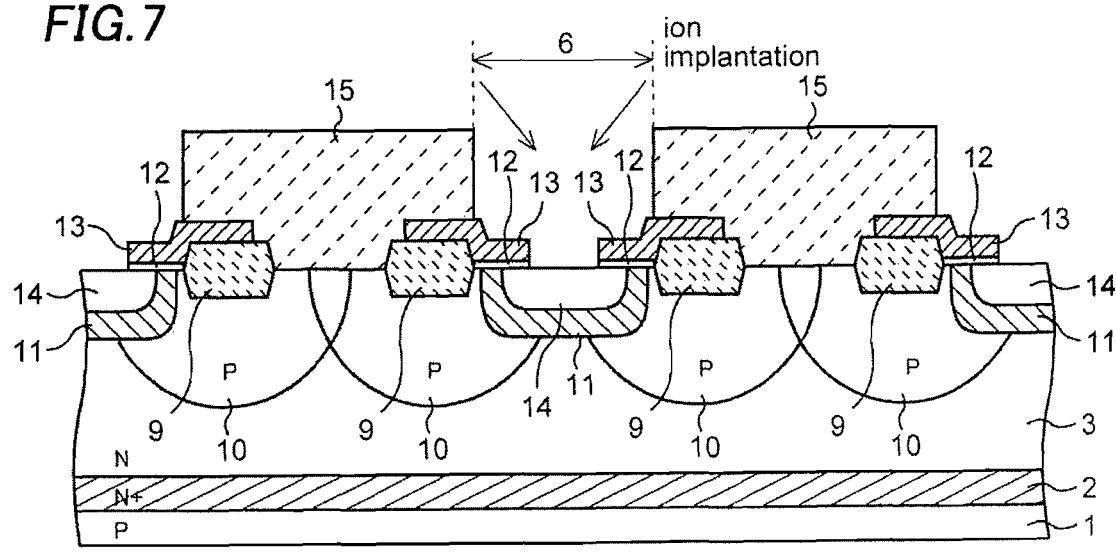
FIG. 7 is a cross-sectional view showing the semiconductor device and the method of manufacturing the same of the invention.

Then, as shown in FIG. 7, a photoresist film 15 having openings in the source cell regions 6 is formed by a predetermined photoresist process. N type impurities are then ion-implanted in the exposed N type body layers 11 at an angle of about 30° relative to the vertical direction to the front surface of the N type body layers 11 using the gate electrodes 13 as a mask. In this case, the ion implantation is performed several times by selfalignment by turning the P type semiconductor substrate 1, thereby forming the N type channel layers 14 with higher concentration than that of the N type body layers 11 inside the N type body layers 11. By annealing at low temperature after the ion implantation, the N type channel layers 14 are diffused to under the gate oxide films 12 under the gate electrodes 13 on both the left and right sides and abut the gate oxide films 12. The desirable N type channel layer 14, of which the front surfaces of the end portions which are in contact with the gate insulation films 12 are positioned symmetrical as shown in FIG. 7, is obtained, since it is formed by ion implantation by turning the P type semiconductor substrate 1 under constant conditions.

Therefore, even when the front surface concentration of the N type body layer 11 on the outside of the N type channel layer 14 is largely low, there occurs no case such that either one of the left and right channel lengths is shorter and there is no need to anxious about an effect of the shorter channel length of either one of the left and right channels. In the embodiment of the invention, the N type channel layer 14 is formed by turning the P type semiconductor substrate 1 by 90° each four times. Furthermore, there occurs no large problem even when the lengths of the left and right end portions of the N type channel layer 14 which are in contact with the gate insulation films 12 are different or the lengths of the left and right end portions of the N type body layer 11 which are in contact with the gate insulation films 12 are different, since the breakdown voltage is determined by the P type drift layers 10 which are in contact with the end portion of the N type body layer 11 and the threshold Vt is determined by the N type channel layer 14 with higher concentration than that of the N type body layer 11.

Figure 8:
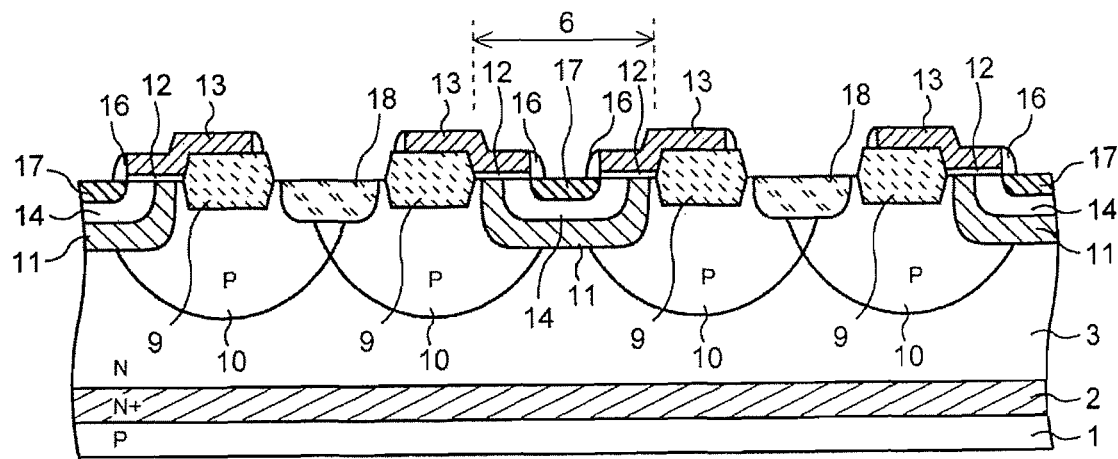
FIG. 8 is a cross-sectional view showing the semiconductor device and the method of manufacturing the same of the invention.
Figure 9A:
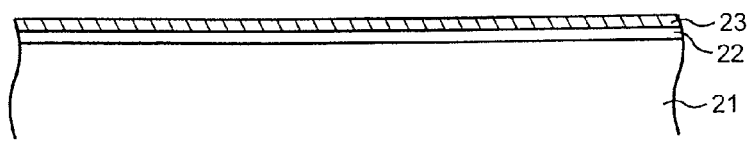
FIGS. 9A to 9E are cross-sectional views showing the conventional semiconductor device and the conventional method of manufacturing the same.
Figure 9B:
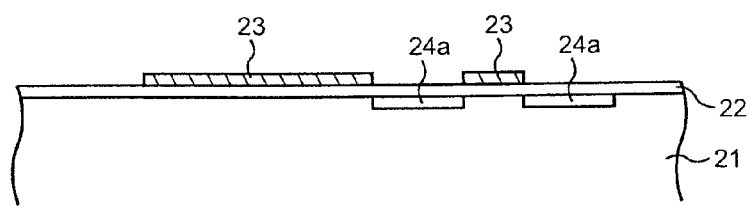
Figure 9C:
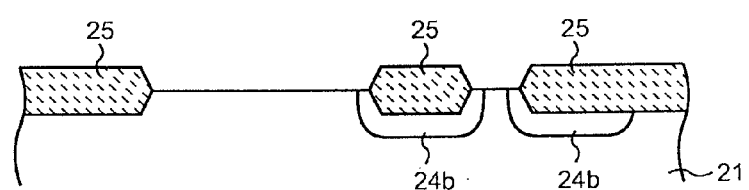
Figure 9D:
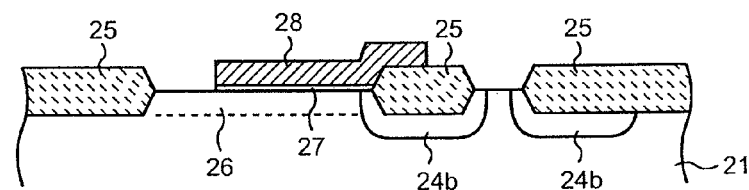
Figure 9E:
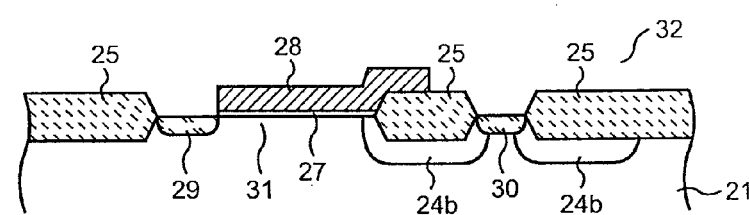

Then, as shown in FIG. 8, an oxide film (not shown) covering the whole front surface of the semiconductor layer is formed by a CVD method, and etched back by predetermined RIE (Reactive Ion Etching), thereby forming sidewalls 16 made of the oxide film on the sidewalls of the gate electrodes 13. Then, a photoresist film (not shown) having openings in the source cell regions 6, the drain layers 18 and so on is formed by a predetermined photolithography process. Then, by ion implantation with a high dose of P-type impurities, the P+ type source layers 17 are formed using the gate electrodes 13 and the sidewalls 16 as a mask, and also the P+ type drain layers 18 are formed using the photoresist film (not shown) as a mask.

In this case, a finer pattern is realized by forming the drain layers 18 by selfalignment using the element isolation insulation films 9 as a mask. Furthermore, since the source layers 17 are formed by selfalignment using the sidewalls 16 as a mask, the positional relations of the source layers 17 to the N type channel layers 14 are almost constant, and the channel lengths formed in the front surface of the N type channel layers 14 are almost constant.

Finally, as shown in FIG. 2, an interlayer insulation film 19 covering the whole surface of the semiconductor layer is formed, then contact holes 20 corresponding to the drain layers 18, the source layers 17 and the gate electrodes 13 (not shown) are formed by a predetermined photolithography process or the like, and a wiring electrode made of aluminum and so on (not shown) are formed, thereby completing a desirable semiconductor device.

As seen from FIG. 2, the P type drift layers 10 are widely diffused from the positions where the element isolation insulation films 9 are formed as centers to expand to under the N type body layers 11, and diffused deepest under the element isolation insulation films 9, respectively, thereby forming wide current paths from the N type body layers 11 to the drain layers 18. Furthermore, since in the embodiment of the invention each of the drain layers 18 is disposed closer to the element isolation insulation film 9 than to the source layer 17, the P type drift layers 10, 10 are diffused to under the drain layer 18 from both the sides of the drain layer 18 and the impurity concentration in this portion is high and the resistance of this portion is decreased. In this manner, since the impurity concentration under the drain layer 18 which is a terminating portion where an electric current is concentrated is high, with the effect of the terminating portion, the resistance of the current path from the source layer 17 to the drain layer 18 is decreased to enhance the current drive ability.

Furthermore, as to the drain breakdown voltage, the positional relations of the N type body layers 11 and the P type drift layers 10 are stabilized since these are formed based on the pattern of the element isolation insulation films 9, and thus the desirable breakdown voltage is obtained by setting the concentrations of these at optimum values respectively. Furthermore, since the P type drift layers 10 are diffused deeper under the element isolation insulation films 9 than immediately under the drain layers as described above, wide current paths are formed, and simultaneously the junction areas are increased and the radius of curvature of the P type drift layers 10 which are diffused deep is increased. Furthermore, under the source layers 17, the P type drift layers 10 expand to the bottoms of the N type body layers 11 to the extent that the P type drift layer 10 does not reach the P type drift layer 10 next thereto. Therefore, depletion layers widely and uniformly expand in the PN junctions formed by the P type drift layer 10 and the N type epitaxial layer 3 and the P type drift layer 10 and the N type body layer 11, thereby advantageously contributing to enhancement of the breakdown voltage. Furthermore, since the N type channel layers 14 determining the threshold are formed by selfalignment using the gate electrodes 13 as a mask and the source layers 17 are also formed by selfalignment using the sidewalls 16 formed on the side end portions of the gate electrodes 13 as a mask, the channel lengths of the channel regions in the high concentration N type channel layers 14 are constant, thereby stabilizing the transistor characteristics.

Although this embodiment provides a structure of the semiconductor substrate including the N+ type embedded layer 2 and so on where a bipolar transistor and so on may also be formed, the invention does not exclude a case of a structure of only a MOS type transistor formed on a semiconductor substrate without the N+ type embedded layer 2 and so on, and also a case of a structure of opposite polarities to the polarities of the embodiment, that is, a case of a structure in which the P type is replaced by the N type and the N type is replaced by the P type, or a case of a structure of a single MOS type transistor also lies within the scope of the invention without apart from the concept of the invention.

The invention enhances a drain breakdown voltage and current drive ability of a high breakdown voltage transistor.

What is claimed is:

1. A semiconductor device comprising:
   a semiconductor layer of a first conductive type; an element isolation insulation film formed on a front surface of said semiconductor layer;
   a body layer of the first conductive type formed on the front surface of said semiconductor layer near one end of said element isolation insulation film;
   a drain layer of a second conductive type formed on the front surface of said semiconductor layer near other end of said element isolation insulation film;
   a source layer of the second conductive type formed on a front surface of said body layer; a gate insulation film formed on said body layer;
   a gate electrode extending from on said element isolation insulation film onto said body layer with said gate insulation film being interposed therebetween; and
   a drift layer expanding in said semiconductor layer from under said drain layer to under said body layer that is under said source layer,
   wherein said drift layer is shallower immediately under said drain layer than under said element isolation insulation film, and gradually becomes shallower from under said element isolation insulation film to said body layer to be in contact with a bottom of said body layer, and in a sectional view of the semiconductor device, the drift layer has a depth profile that is curved to have a peak under the element isolation insulation film and is not flat under the element isolation insulation film,
   wherein said drift layer under said drain layer is superposed with other drift layer next thereto.

2. The semiconductor device of claim 1, wherein said drift layer under said body layer is not superposed with other drift layer next thereto.

3. The semiconductor device of claim 1, wherein said body layer comprises a channel layer of the first conductive type formed on the front surface of said body layer, and a concentration of said channel layer is higher than a concentration of said body layer.

* * * * *